United States Patent
Nomoto et al.

(10) Patent No.: US 7,091,665 B2
(45) Date of Patent: Aug. 15, 2006

(54) PLASMA DISPLAY APPARATUS

(75) Inventors: Tomihide Nomoto, Hyogo (JP);
Kazunobu Kojima, Nara (JP); Akira Mizuno, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 143 days.

(21) Appl. No.: 10/311,433

(22) PCT Filed: Jun. 12, 2002

(86) PCT No.: PCT/JP02/05841

§ 371 (c)(1),
(2), (4) Date: Jun. 2, 2003

(87) PCT Pub. No.: WO02/103660

PCT Pub. Date: Dec. 27, 2002

(65) Prior Publication Data

US 2004/0027073 A1    Feb. 12, 2004

(30) Foreign Application Priority Data

Jun. 15, 2001    (JP) ............................. 2001-181305

(51) Int. Cl.
*H01J 17/49*    (2006.01)
*H01J 17/34*    (2006.01)
*H01J 17/35*    (2006.01)

(52) U.S. Cl. ..................... 313/583; 313/587; 313/567; 361/681

(58) Field of Classification Search ............ 313/49–51, 313/583; 361/816, 681
See application file for complete search history.

(56) References Cited

U.S. PATENT DOCUMENTS 6,359,390 B1 * 3/2002 Nagai ...................... 315/169.1
6,560,124 B1 * 5/2003 Irie et al. ..................... 361/816

FOREIGN PATENT DOCUMENTS

| JP | 5-27988 | 4/1993 |
| JP | 9-6479 | 1/1997 |
| JP | 09006479 | * 1/1997 |
| JP | 9-306582 | 11/1997 |
| JP | 11-242442 | 9/1999 |
| JP | 2000-196278 | 7/2000 |

* cited by examiner

*Primary Examiner*—Mariceli Santiago
*Assistant Examiner*—Elizabeth Rielley
(74) *Attorney, Agent, or Firm*—Wenderoth, Lind & Ponack, L.L.P.

(57) ABSTRACT

A plasma display apparatus is equipped with a signal input terminal responsive to a user's application. The plasma display apparatus includes a panel including a pair of substrates, wherein at least one of the substrates is transparent. The substrates are placed opposite to each other to form a discharge space in between, and electrodes are provided to the substrate. The plasma display apparatus also includes a display driving circuit block, disposed on a chassis and equipped with at least one signal inputting connector which applies a signal to the panel to perform displaying, and an input signal circuit block detachable to the signal inputting connector of the display driving circuit block.

10 Claims, 12 Drawing Sheets

FIG. 1

Discharging space

PLASMA DISPLAY APPARATUS

TECHNICAL FIELD

The present invention relates to plasma display apparatuses which are thin, light weight, and have a large display area.

BACKGROUND ART

Plasma display apparatuses are widely used as display apparatuses installed in busy sections of a city for the general public, or installed at a home for a family to enjoy videos on a large screen. A plasma display panel (PDP) has better characteristics than a liquid crystal panel in the following points: responding at a faster speed, a wider viewing angle, easier to produce a larger screen, and higher display quality due to self-light-emitting.

In the PDP, display cells partitioned with barrier ribs are disposed on a board, and a phosphor layer covers the display cells. An ultraviolet ray generated by gas discharge excites the phosphor to emit light for color display.

The PDP is largely classified into an alternating current (AC) driving system and a direct current (DC) driving system, and into a surface discharge and an opposite discharge. A three-electrodes, AC driving and surface discharge PDP takes the mainstream of the PDP because of its high resolution, easiness of producing a large screen and easiness of fabrication. This PDP comprises the following elements:

- a first substrate having a pair of display electrodes adjacent to each other in parallel; and
- a second substrate having address electrodes arranged in a direction crossing the display electrodes, barrier ribs and a phosphor layer.

This structure allows the phosphor layer to be rather thick, and is suitable for color display.

On the other hand, the PDP can be used as a large size display in various applications, so that its input signal terminal is desirably connectable to various external apparatuses such as a personal computer, a television receiver, and a video cassette recorder. Those apparatuses output their video signals including information signals.

A plasma display apparatus is thus equipped with various signal-input-terminals to receive as many external signals as possible. Users in the consumer market, however, scarcely use every signal-input terminal, but use one specific terminal for a particular external apparatus. Therefore, a number of the various signal-input terminals are useless for the users in the consumer market.

Plural types of plasma display apparatuses may be produced so that particular signal-input terminals responsive to users' applications can be provided. However, there will be a lot of models of one product because of the many applications discussed above, which lowers the productivity.

The present invention addresses the foregoing problem and aims to provide with ease a plasma display apparatus having a signal-input terminal responsive to a user's application.

SUMMARY OF THE INVENTION

The plasma display apparatus of the present invention comprises the following elements to overcome the problem discussed above:
- a panel;
- a display driving circuit block, disposed in a chassis, for applying a signal to the panel to display;
- an input signal circuit block coupled between the display driving circuit block and an external apparatus which outputs video signals; and
- a housing that accommodates the panel, the display driving circuit block and the input signal circuit block.

The input signal circuit block includes the following elements:
- a case disposed in the chassis and having a mounting port open to outside of the housing;
- a signal outputting connector detachably mounted to the case at the mounting port, whereby the connector is coupled detachably to a signal inputting connector of the display driving circuit block; and
- a block unit having an input terminal section to which a connecting cable to an external apparatus can be coupled detachably.

This structure allows for the preparation of a number of block units having an input terminal section responsive to an external apparatus to be coupled to the plasma display apparatus. The block unit can be replaced with another one that is responsive to a user's request, so that the plasma display apparatus equipped with a signal input terminal appropriate to an application can be prepared with ease.

DETAILED DESCRIPTION OF THE PREFERRED EMBODIMENT OF THE INVENTION

An exemplary embodiment of the present invention is demonstrated hereinafter with reference to the accompanying FIG. 1 through FIG. 16. The present invention is not limited to this embodiment.

Figure 1:
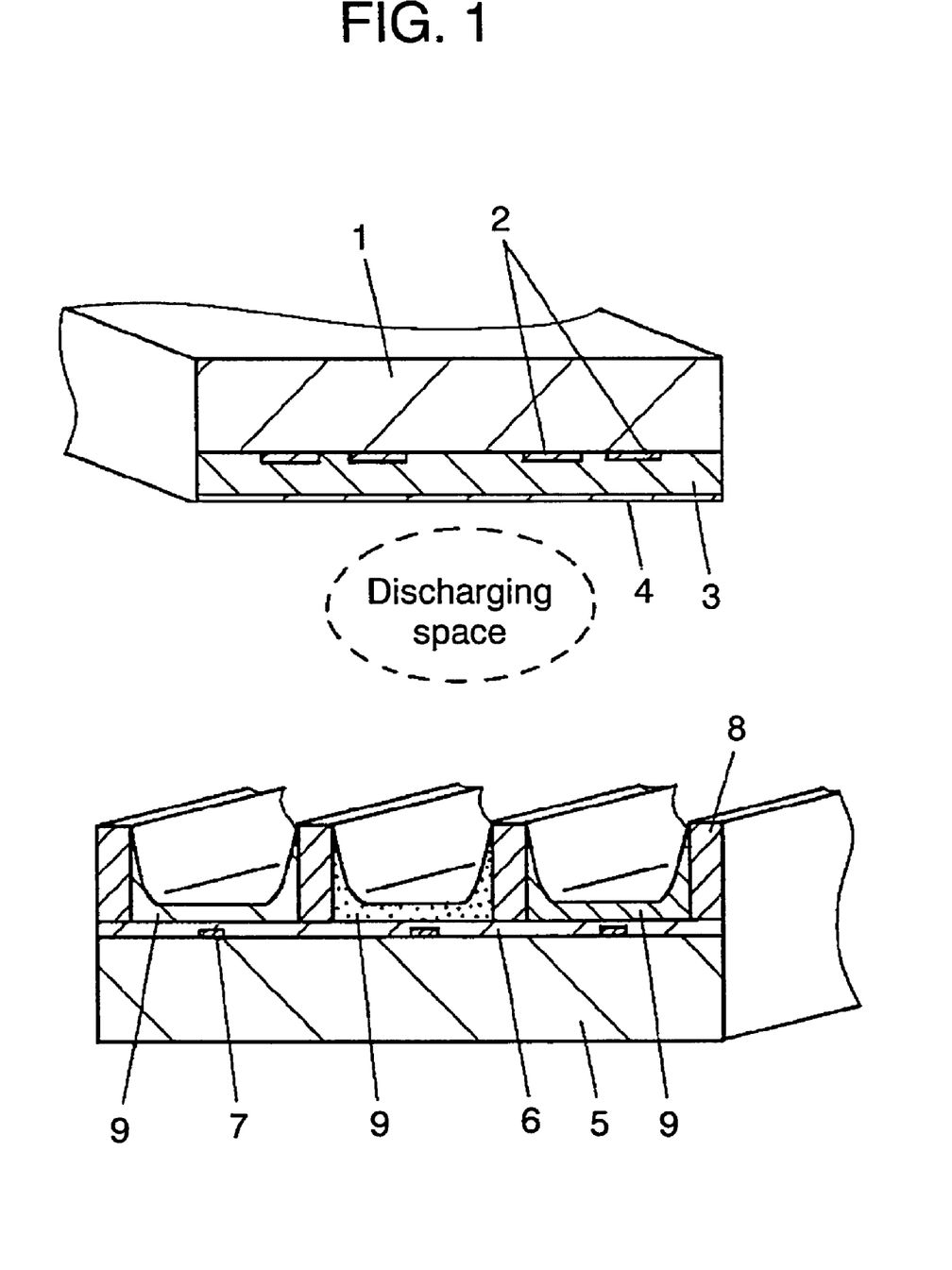
FIG. 1 shows a perspective sectional view illustrating a schematic structure of a PDP of a plasma display apparatus in accordance with an exemplary embodiment of the present invention.

A structure of a plasma display panel (PDP) of a plasma display apparatus is described with reference to FIG. 1. As shown in FIG. 1, a transparent front substrate 1, such as a glass substrate, has plural rows of stripe-shaped display electrodes 2 as pairs of a scan electrode and a sustain electrode formed thereon. Dielectric layer 3 covers the electrodes, and protective film 4 is formed on top of dielectric layer 3.

A back substrate 5, disposed opposite to the front substrate 1, has plural rows of address electrodes 7 shaped like stripes formed thereon, such that they cross with display electrodes 2 forming the scan and sustain electrodes. Overcoat layer 6 covers address electrodes 7. On top of overcoat layer 6, plural barrier ribs 8 are prepared between and in parallel with address electrodes 7. Phosphor layer 9 is disposed on lateral faces of barrier ribs 8 and on the surface of overcoat layer 6.

Front substrate 1 and back substrate 5 are placed opposite to each other with a fine discharge space therebetween such that display electrodes 2 forming the scan electrodes and sustain electrodes cross with address electrodes 2 at approximately right angles. The circumferences of substrates 1 and 5 are sealed, and the fine space is charged with discharge gas formed of one of Helium, Neon, Argon and Xenon, or mixed gas of those gasses. Partitioning the discharge space with barrier ribs 8 into plural sections provides plural discharge cells, in each of which an intersection of display electrode 2 and address electrode 7 is positioned. In each one of the discharge cells, phosphor layer 9 is placed sequentially such that each cell is assigned to red, green and blue independently.

Figure 2:
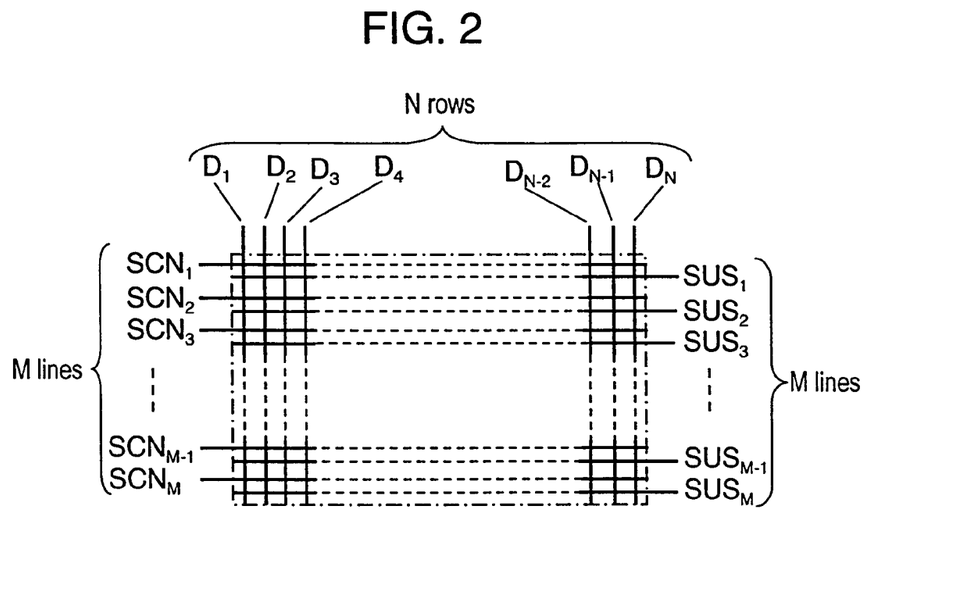
FIG. 2 illustrates arrays of electrodes of the PDP of the plasma display apparatus in accordance with the exemplary embodiment of the present invention.

FIG. 2 illustrates a placement of the electrodes of this PDP. As shown in FIG. 2, the scan electrodes with the sustain electrodes and the address electrodes make a matrix of M lines×N rows. In a line direction, the scan electrodes SCN1 through SCNM and sustain electrodes SUS1 through SUSM are arrayed in M lines. In a row direction, address electrodes D1 through DN are arrayed in N rows.

In the PDP having the foregoing electrode structure, a write-pulse is applied between the address electrodes and the scan electrodes, so that address discharge is performed between the address electrodes and the scan electrodes for selecting discharge cells. Then, cyclic sustain pulses reversing alternately are applied between the scan electrodes and the sustain electrodes, so that sustain discharge is performed for displaying a given indication.

Figure 3:
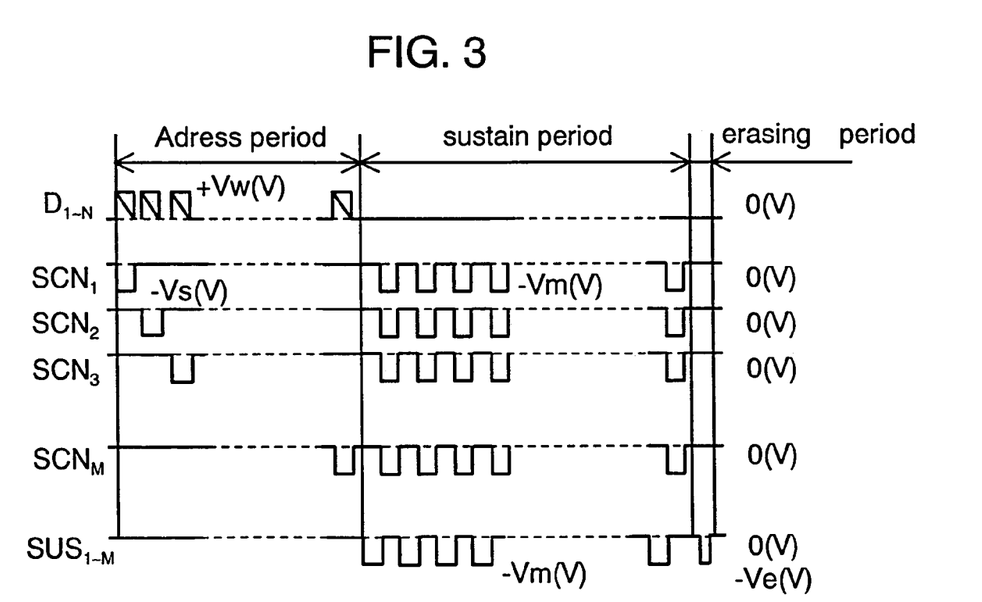
FIG. 3 shows a signal waveform for driving the plasma display apparatus in accordance with the exemplary embodiment of the present invention.

FIG. 3 shows a timing chart of a display driving circuit of the plasma display apparatus. As shown in FIG. 3, during an address period, each one of sustain electrodes SUS1 through SUSM is held at 0 volt (V). Then a positive pulse voltage +Vw (V) is applied to given address-electrodes D1 through DN corresponding to the discharge cells indicating the first line, and negative scanning pulse voltage −Vs (V) is applied to scan electrode SCN1 corresponding to the first line. As a result, address-discharge occurs at the intersections of the given address-electrodes D1 through DN and scan electrode SCN1 on the first line.

Next, positive address-pulse voltage +Vw (V) is applied to given address-electrodes D1 through DN corresponding to the discharge cells indicating the second line, and negative scanning pulse voltage −Vs (V) is applied to scan electrode SCN2 assigned to the second line. As a result, address-discharge occurs at the intersections of the given address-electrodes D1 through DN and scan electrode SCN1 on the second line.

Similar procedures to the above are sequentially carried out, and finally positive address-pulse voltage +Vw (V) is applied to given address-electrodes D1 through DN corresponding to the discharge cells indicating the line M. Negative scanning pulse voltage −Vs (V) is applied to scan electrode SCNM assigned to the line M. As a result, address-discharge occurs at the intersections of the given address-electrodes D1 through DN and scan electrode SCNM on the line M.

During the next sustain period, each one of scan electrodes SCN1 through SCNM is once held at 0 (V), and negative sustain pulse voltage −Vm (V) is applied to each one of sustain electrodes SUS1 through SUSM. As a result, sustain discharge occurs between scan electrodes SCN1 through SCNM and sustain electrodes SUS1 through SUSM at the intersections where address discharge has occurred. Then, negative sustain pulse voltage −Vm (V) is applied alternately to all the scan electrodes SCN1 through SCNM and all the sustain electrodes SUS1 through SUSM, so that sustain discharge occurs continuously at the discharge cells to be displayed. The light emission due to this sustain discharge makes the PDP display.

In the next erasing period, all scan electrodes SCN1 through SCNM are once held at 0 (V), and erasing pulse voltage −Ve (V) is applied to all sustain electrodes SUS1 through SUSM. As a result, erasing discharge occurs to halt the discharging.

The foregoing operation is necessary for the plasma display apparatus to display one shot of video.

Figure 4:
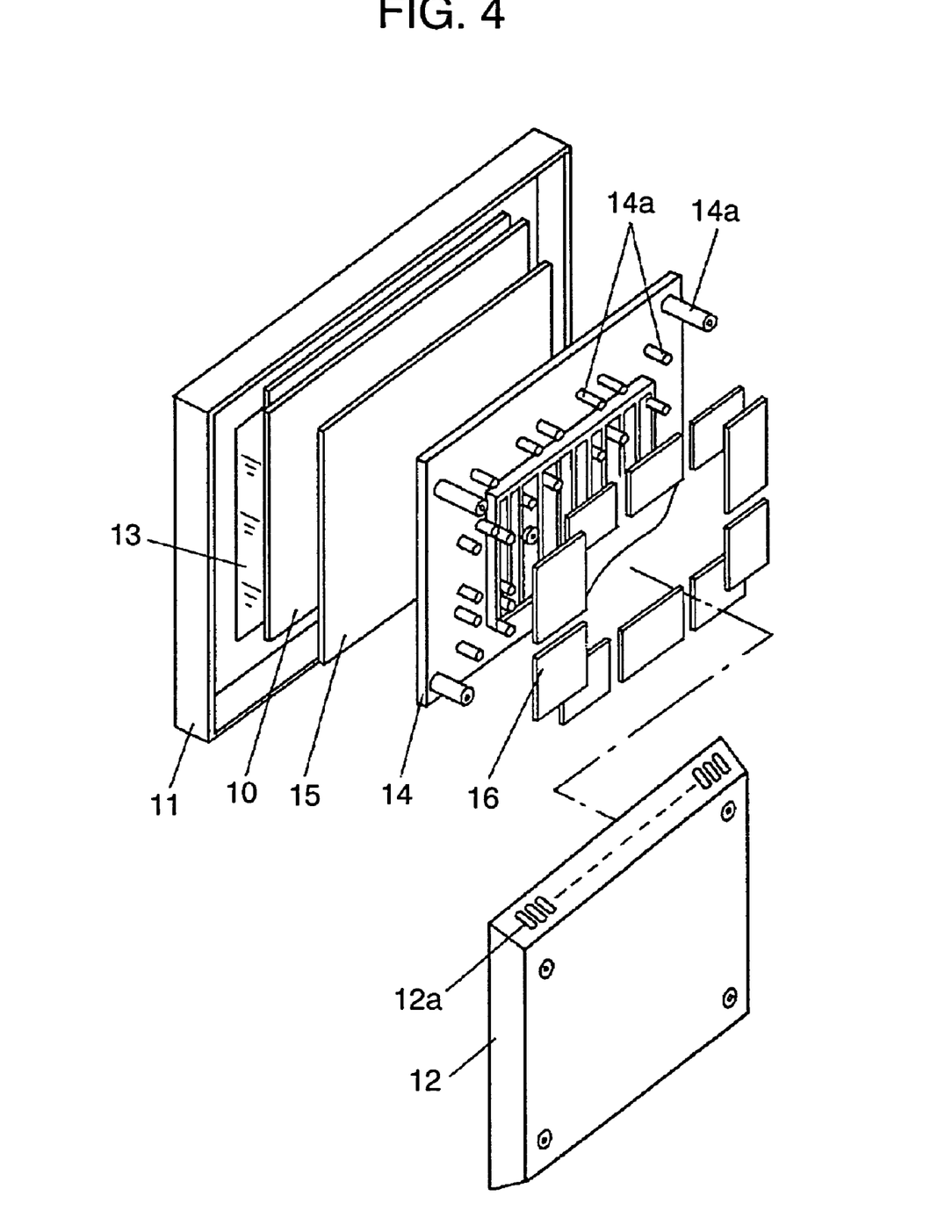
FIG. 4 is an exploded perspective view illustrating an inside of the plasma display apparatus in accordance with the exemplary embodiment of the present invention.

FIG. 4 shows an entire structure of a plasma display apparatus integrating the foregoing PDP therein. In FIG. 4, the housing, which accommodates PDP 10, comprises front frame 11 and metallic back cover 12. In the opening of front frame 11, front cover 13 formed of an optical filter and glass that protect PDP 10 is placed. In order to suppress interference radiation of electromagnetic waves, silver evaporation, for instance, is provided to front cover 13. Further, plural vent holes 12a are provided to back cover 12 in order to dissipate the heat generated in PDP 10 to the outside.

PDP 10 is bonded to a front face of chassis 14, made from aluminum, via heat conductive sheet 15. On the rear side of chassis 14, plural circuit blocks 16 for driving and displaying PDP 10 are mounted. Heat conductive sheet 15 transfers the heat generated in PDP 10 to chassis 14 efficiently for dissipating the heat. Circuit blocks 16 include electric circuits that drive and display PDP 10 and control those operations. Circuit blocks 16 are electrically coupled to electrode-leads extending to edges of PDP 10 via flexible wired boards (not shown) extending over the four edges of chassis 14.

On the rear face of chassis 14, plural bosses 14a are unitarily formed by die-casting. Bosses 14a are used for mounting circuit blocks 16 and fixing back cover 12. Chassis 14 can be a flat aluminum plate with pins fixed thereon.

Figure 5:
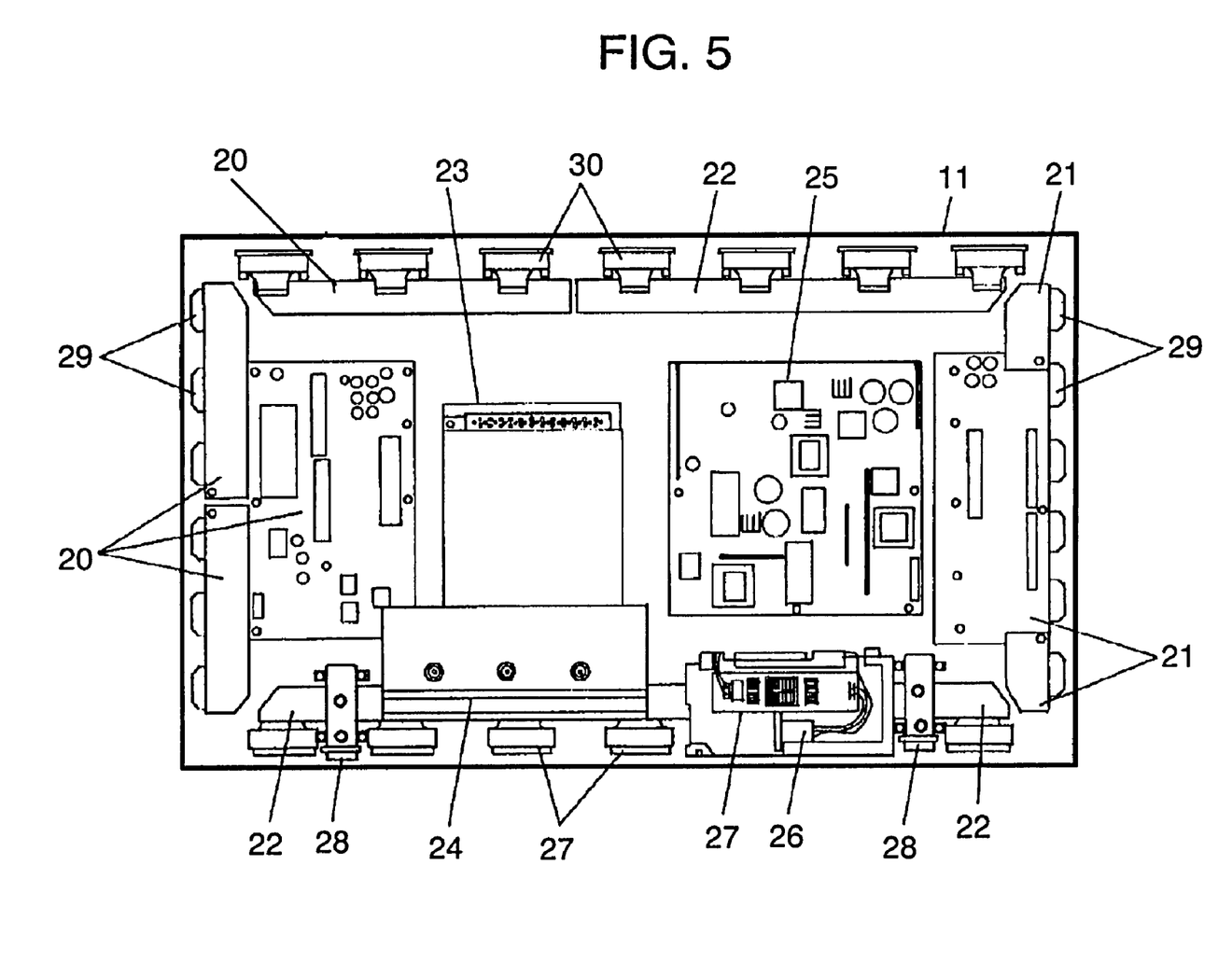
FIG. 5 is a plan view illustrating a placement of elements on a chassis of the plasma display apparatus in accordance with the exemplary embodiment of the present invention.

FIG. 5 shows a plan view of the interior of the foregoing plasma display apparatus viewed behind the apparatus with back cover 12 detached. In FIG. 5, scan driver circuit block 20 supplies a given signal voltage to the scan electrodes of PDP 10, and sustain driver circuit block 21 supplies a given signal voltage to the sustain electrodes of PDP 10. Address driver circuit block 22 supplies a given signal voltage to the address electrodes of PDP 10. Scan driver circuit block 20 and sustain driver circuit block 21 are placed respectively on the either ends of chassis 14 in a width direction. Address driver circuit blocks 22 are placed on the upper and lower ends of chassis 14 in a height direction.

Control circuit block 23 converts video data, based on video signals sent from input signal circuit block 24, into video data signals responsive to the number of pixels of PDP 10 and supplies the video data signals to address driver circuit block 22. Input signal circuit block 24 is equipped with input terminals to which cables, connected to an external apparatus such as a television tuner, are connected detachably. Control circuit block 23 further generates a discharge control timing signal and supplies it to scan driver circuit block 20 and sustain driver circuit block 21, and is equipped with a display and drive circuit block that controls display and drive such as controlling a gray-scale. Control circuit block 23 is placed substantially at the center of chassis 14.

Power supply block 25 is disposed substantially at the center of chassis 14 similar to control circuit block 23 and supplies the commercial power voltage to the foregoing circuit blocks through power-supply input block 27 that includes power cable connector 26 to which a power cable (not shown) is connected.

Bracket 28 is to be fixed to a stand pole, and is mounted on chassis 14 at a lower end in a height direction. Tips of the stand pole mounted to a stationary stand are inserted into a hole of each bracket 28, and the stand pole is fixed to bracket 28 with screws, so that the stand is fit to the apparatus. As a result, the PDP is held in a standing posture.

Flexible wired board 29 couples the scan electrodes and leads of the sustain electrodes to the printed circuit boards of scan driver circuit block 20 and sustain driver circuit block 21. Flexible wired board 30 couples leads of the address electrodes to the printed circuit board of address driver circuit block 22. Those flexible wired boards are bent 180 degrees so that the boards are routed from the front side to the back side of PDP 10.

Figure 6:
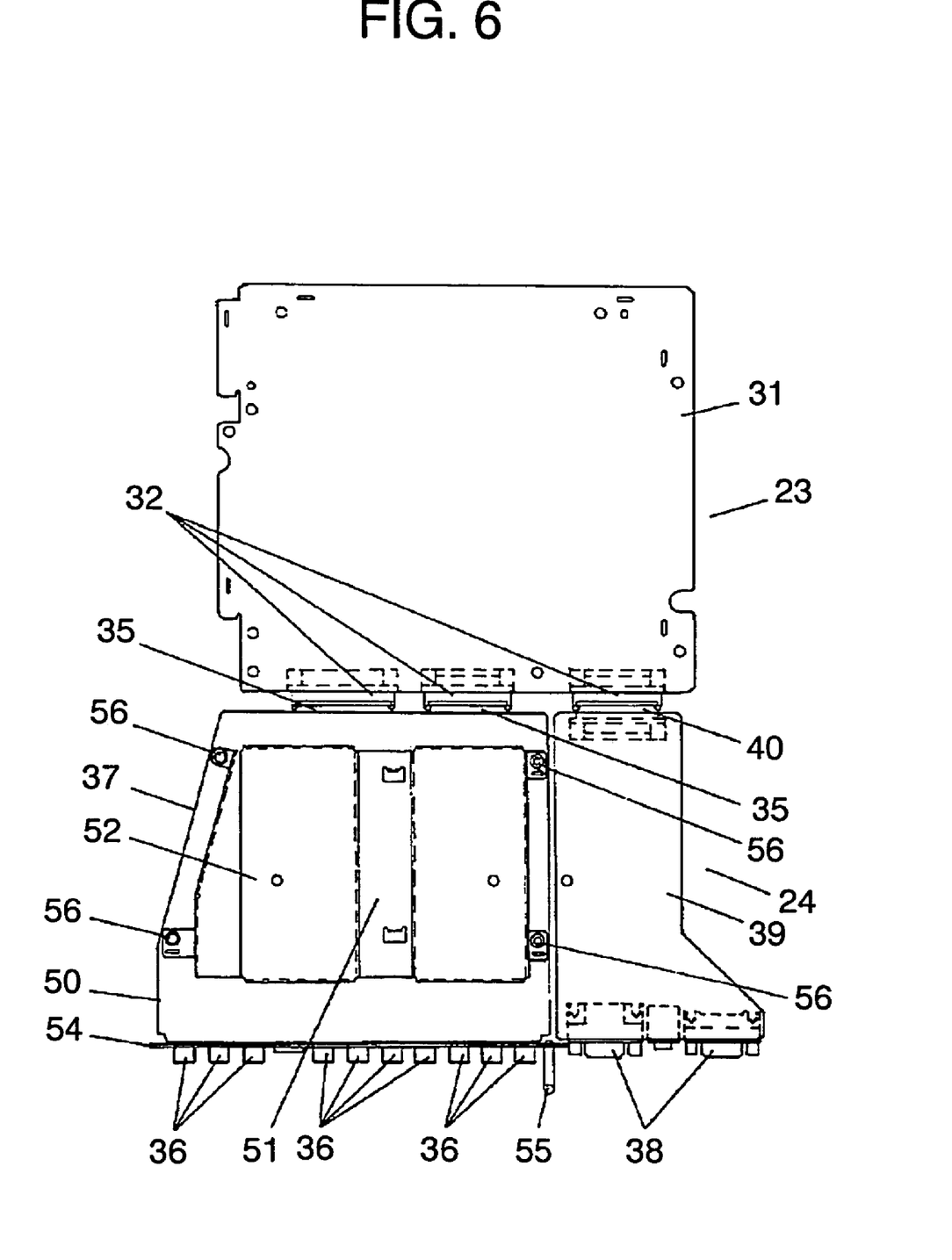
FIG. 6 is a plan view illustrating a structure of an input signal circuit block of the plasma display apparatus in accordance with the exemplary embodiment of the present invention.
Figure 7:
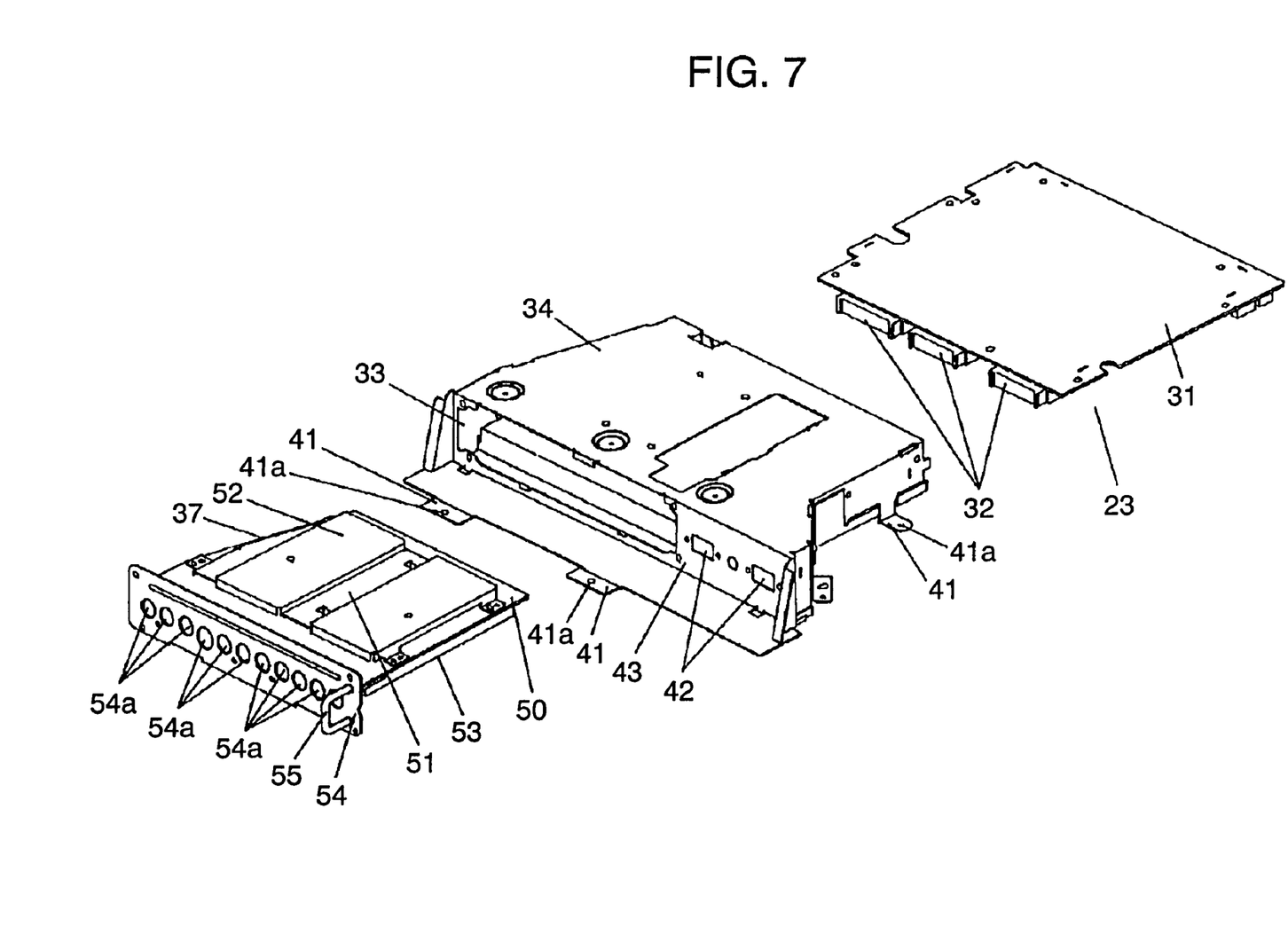
FIG. 7 is an exploded perspective view illustrating a structure of the input signal circuit block and a control circuit block of the plasma display apparatus in accordance with the exemplary embodiment of the present invention.

FIG. 6 and FIG. 7 show the structures of control circuit block 23 and input signal circuit block 24. Those elements are detailed hereinafter. On circuit board 31 of block 23, a micro processor, a driver IC, electric circuit components and the like are mounted to form a given control circuit. Control circuit block 23 is thus constructed. Circuit board 31 is rigidly mounted to chassis 14 with screws substantially in parallel with PDP 10. On an edge of circuit board 31, signal inputting connectors 32 are placed, and signals are supplied from input signal circuit block 24 through those connectors 32.

Input signal circuit block 24 is placed on chassis 14 approximately in parallel with PDP 10, and includes case 34, first signal-outputting connector 35 and first block unit 37. Case 34 has mounting port 33 open to the outside through back cover 12. First signal outputting connector 35 is detachably coupled to case 34 via mounting port 33 thereby being coupled detachably to signal inputting connector 32 of control circuit block 23. First block-unit 37 has first input-terminal 36 to which a connection cable for coupling to an external apparatus is detachably coupled.

Case 34 includes second block-unit 39 therein having second input terminal 38 to which a connection cable, for coupling to another external apparatus such as a tuner or a personal computer, is detachably coupled. Second signal outputting connector 40 is always coupled to signal inputting connector 32 of control circuit block 23. Case 34 is omitted in FIG. 6, and first input terminal 36 and second block-unit 39 are omitted in FIG. 7.

Figure 8:
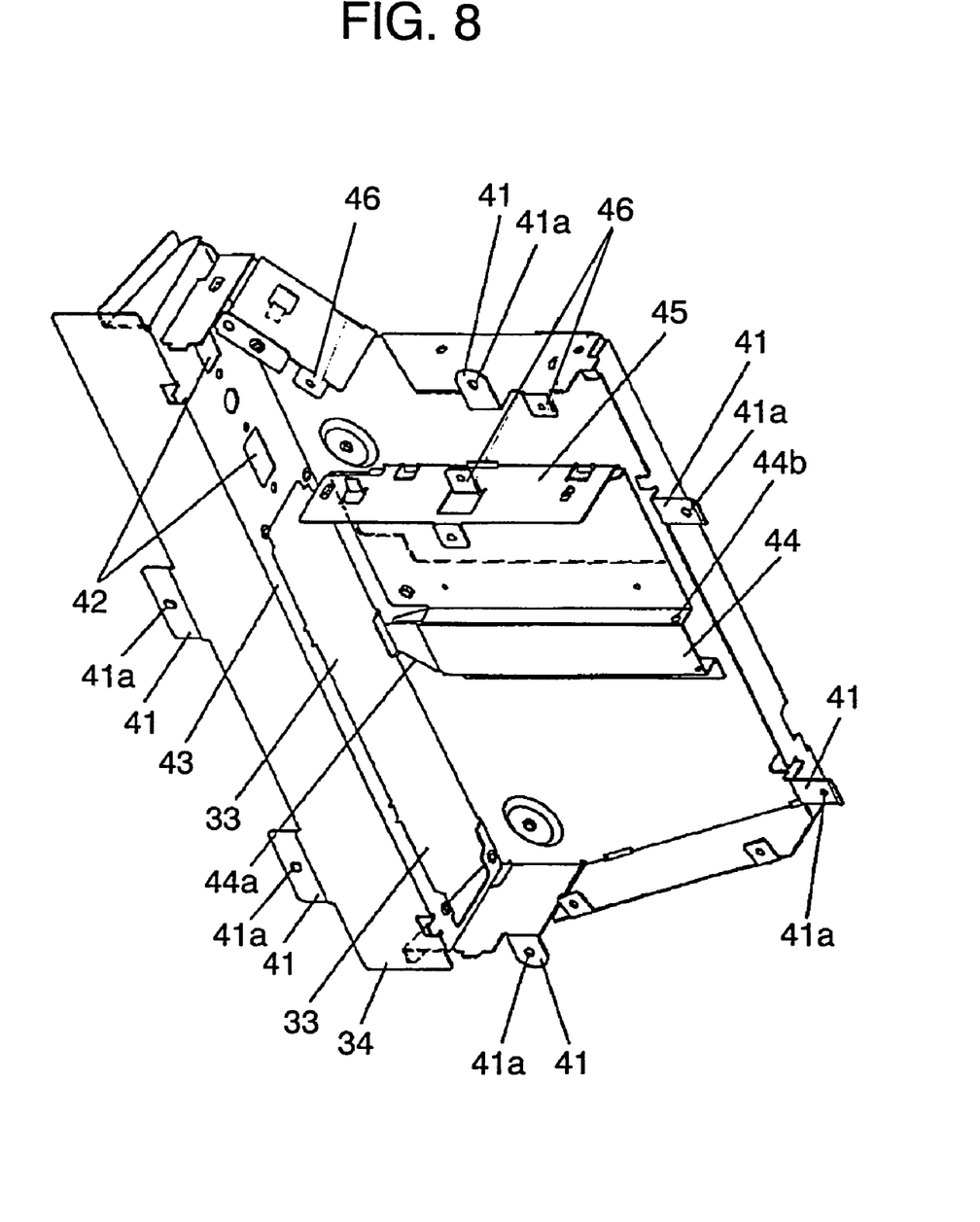
FIG. 8 is a perspective view, viewed from the bottom, illustrating a structure of a case of the input signal circuit block of the plasma display apparatus in accordance with the exemplary embodiment of the present invention.

Case 34 is formed by bending a metal plate, and as shown in FIG. 7 and FIG. 8, the face thereof opposite to chassis 14 includes tabs 41 unitarily formed with case 34 and disposed at various places. Tab 41 has a mounting hole 41a through which a screw extends for mounting case 34 to chassis 14. Another face of case 34 substantially vertical to the mounting face discussed above includes mounting port 33 and terminal port 43. Terminal port 43 has openings 42 to which second input-terminal 38 of second block unit 39 built in case 34 are placed. Case 34 is mounted to chassis 14 through an opening (not shown) provided to back cover 12 with terminal port 43 exposed to the outside.

Protruding guide plate 44 is mounted on the inside wall of case 34 extendedly in a direction vertical to mounting port 33. Guide plate 44 is formed by bending a metal plate. When first block unit 37 is inserted into case 34 through mounting port 33, first signal outputting connector 35 of first block unit 37 is guided with guide plate 44 before it is easily fit to signal inputting connector 32 of control circuit block 23. A first end of guide plate 44 has tapering section 44a toward mounting port 33, and a second end has protrusion 44b.

Upper face of case 34 is notched, and a section separated by the notches is bent inside, which forms standing wall 45 inside case 34, so that first block-unit 37 is partitioned from second block-unit 39 by standing wall 45, which also electromagnetically shields second block-unit 39. Second block-unit 39 placed in a shielded space surrounded by case 34 and wall 45 is mounted to tabs 46 with screws.

Figure 9:
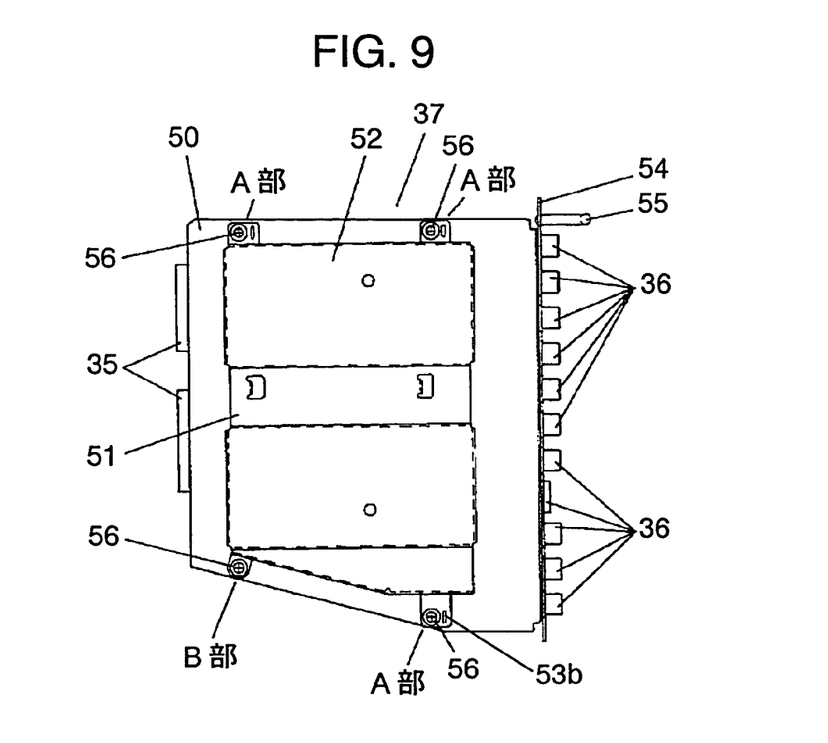
FIG. 9 shows a top view of a block unit of the input signal circuit block of the plasma display apparatus in accordance with the exemplary embodiment of the present invention.
Figure 10:
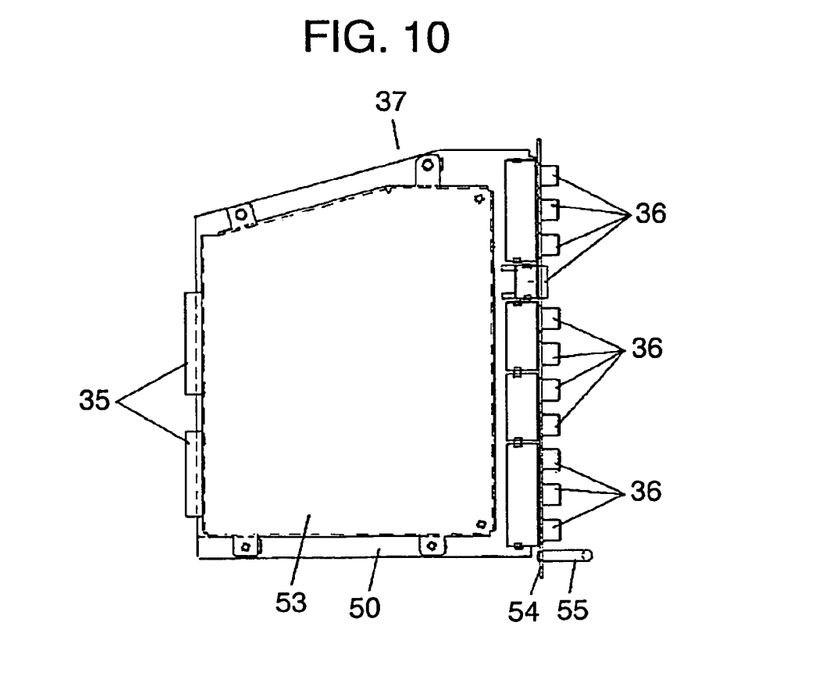
FIG. 10 shows a bottom view of the block unit of the input signal circuit block of the plasma display apparatus in accordance with the exemplary embodiment of the present invention.
Figure 11:
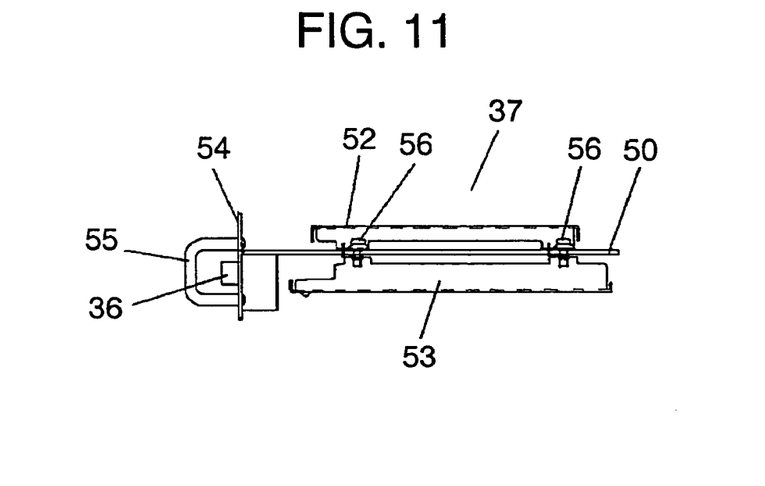
FIG. 11 shows a lateral view of the block unit of the input signal circuit block of the plasma display apparatus in accordance with the exemplary embodiment of the present invention.
Figure 12:
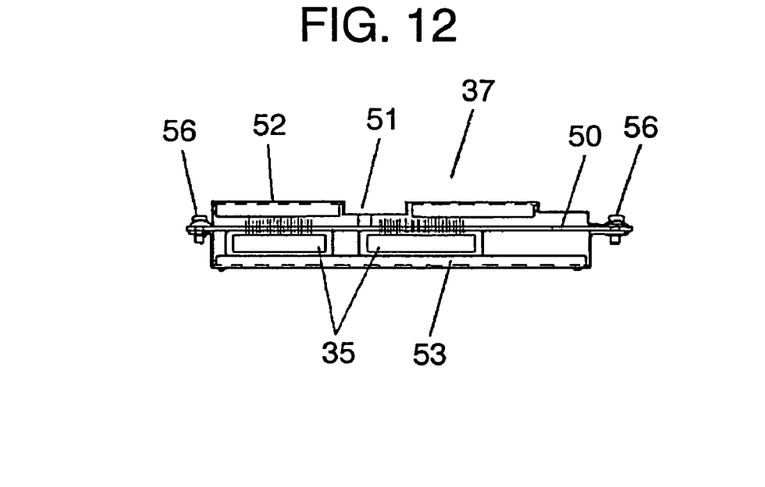
FIG. 12 shows a back view of the block unit of the input signal circuit block of the plasma display apparatus in accordance with the exemplary embodiment of the present invention.
Figure 13:
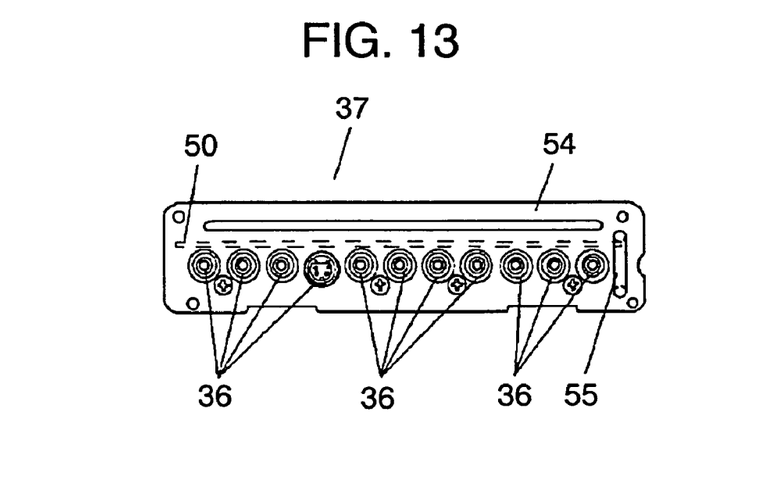
FIG. 13 shows a front view of the block unit of the input signal circuit block of the plasma display apparatus in accordance with the exemplary embodiment of the present invention.

FIG. 9 through FIG. 13 detail the structure of first block-unit 37. FIG. 9 shows a top view, FIG. 10 shows a bottom view, FIG. 11 shows a lateral view, FIG. 12 shows a rear view from the side of first signal outputting connector 35, and FIG. 13 shows a front view from first input-terminal 36 side.

First block-unit 37 electromagnetically shields circuit board 50, to which electric circuit components and ICs forming input signal circuits are mounted, and components, which form the input signal circuits and are mounted on the upper face of board 50. First block-unit 37 comprises shielding plate 52 including recessed guide 51 which fits to guide plate 44 mounted on the inside wall of case 34, and shielding plate 53 that electromagnetically shields the components forming the input signal circuits mounted on a lower face of circuit board 50. The foregoing two shielding plates 52, 53 are approximately the same size, and fixed to circuit board 50 at the same position on board 50. Guide 51 of shielding plate 52 is formed by recessing plate 52.

On an edge of circuit board 50, terminals of first signal outputting connectors 35 are electrically connected and fixed. On the edge of the other side of board 50, plural holes 54a are formed so that first input terminals 36 electrically connected to board 50 can extend through, and terminal plate 54 having U-shaped metal bracket 55 is mounted.

Figure 14:
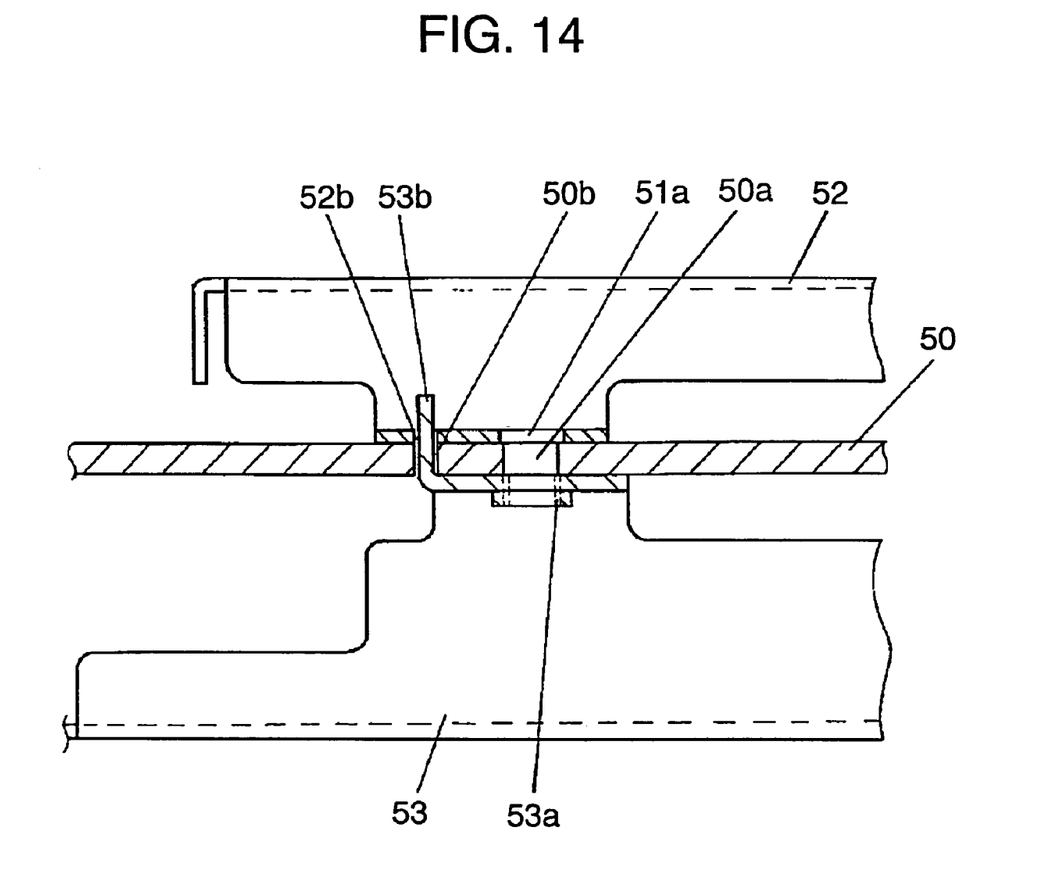
FIG. 14 is a detailed sectional view of section A of the block unit shown in FIG. 9.
Figure 15:
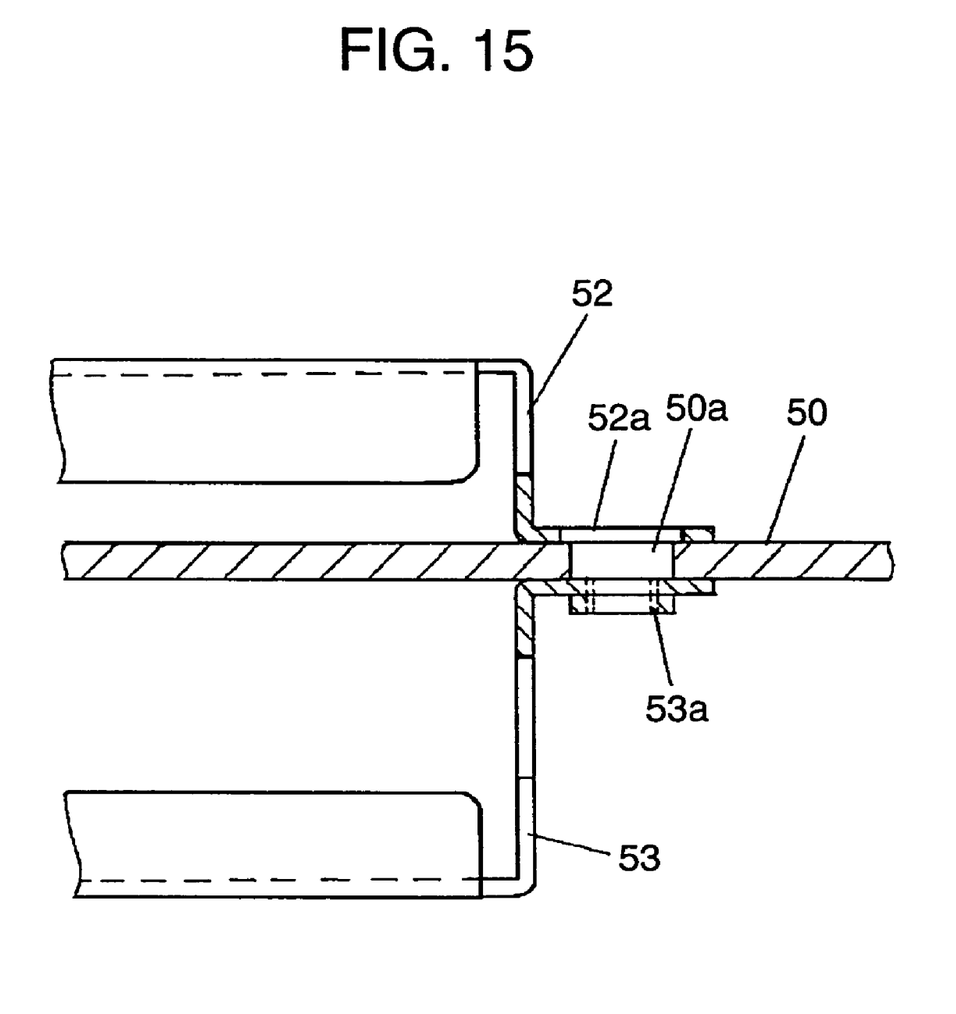
FIG. 15 is a detailed sectional view of section B of the block unit shown in FIG. 9.

FIG. 14 and FIG. 15 show enlarged views illustrating in detail the mounting of shielding plates 52 and 53 to circuit board 50. FIG. 14 is an enlarged view of section A in FIG. 9, and FIG. 15 is an enlarged view of section B in FIG. 9.

As shown in FIGS. 9, 14 and 15, holes 50a and 52a for receiving screws 56 are provided to circuit board 50 and shielding plate 52. Tapped hole 53a for receiving screw 56 is provided to shielding plate 53. At section A in FIG. 9, square holes 50b and 52b are provided adjacent to hole 50a and 52a to board 50 and plate 52, as shown in FIG. 14. Tab 53b is provided to plate 53 and inserted into square holes 50b and 52b for positioning.

In other words, insertion of tab 53b into square holes 50b and 52b provided board 50 and plate 52 positions shielding plates 52 and 53 with respect to circuit board 50. Then screw 56 extends through holes 50a and 52a provided to board 50 and plate 52 and is screwed in tapped hole 53a provided to shielding plate 53. As a result, shielding plates 52, 53 can be positioned and mounted to circuit board 50 by only screw 56.

In the exemplary embodiment shown in FIG. 13, first block-unit 37 of input signal circuit block 24 uses 11 pin-jacks as first input terminal 36 for receiving various apparatuses such as a VCR and a DVD player. However, it is not limited to this preparation, but it could be terminal plate 54 as shown in FIG. 16(a) through FIG. 16(f).

Figure 16A:
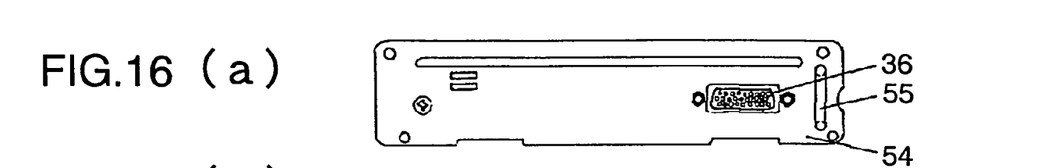
FIG. 16(a) through FIG. 16(f) are plan views illustrating other examples of input terminals of the input signal circuit block of the plasma display apparatus in accordance with the exemplary embodiment of the present invention.

The example shown in FIG. 16(a) is equipped with only a connector as first input terminal 36 for connecting a cable to a tuner. In this case, second input terminal 38 of block-unit 39 in input-signal circuit block 24 uses a connector to be coupled to a personal computer.

Figures 16B, 16C:
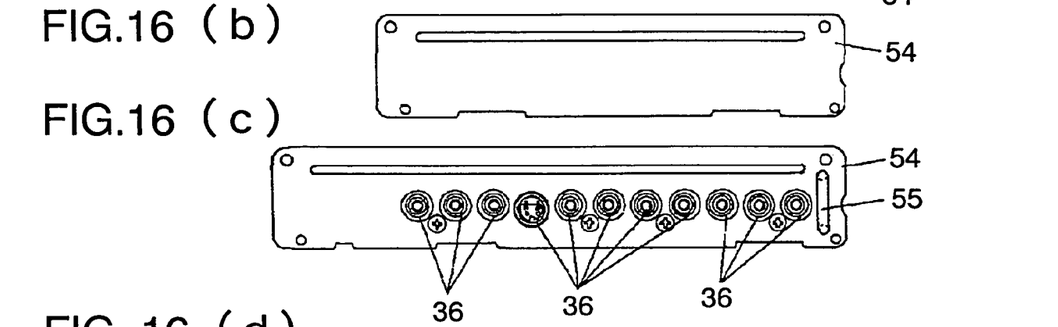

The example shown in FIG. 16(b) does not place first input terminal 36 at terminal plate 54 of block-unit 37. In this case, an external apparatus supplies signals only to second input terminal 38 of block-unit 39.

Figure 16D:
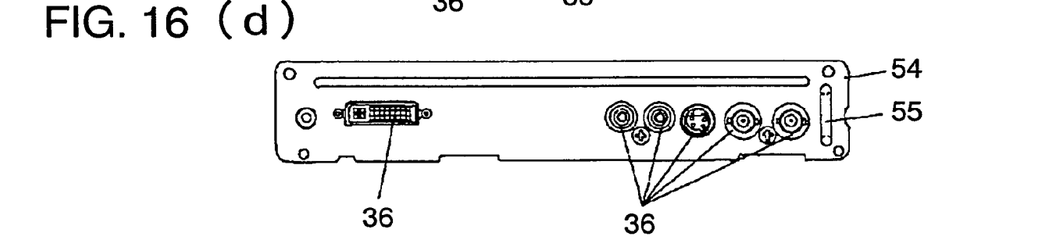
Figure 16E:
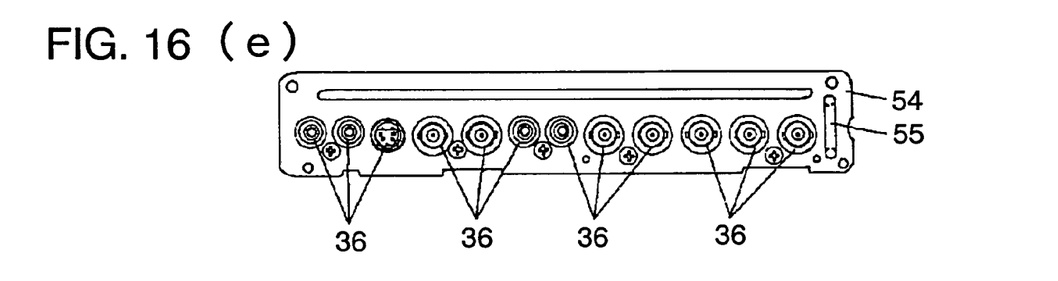
Figure 16F:
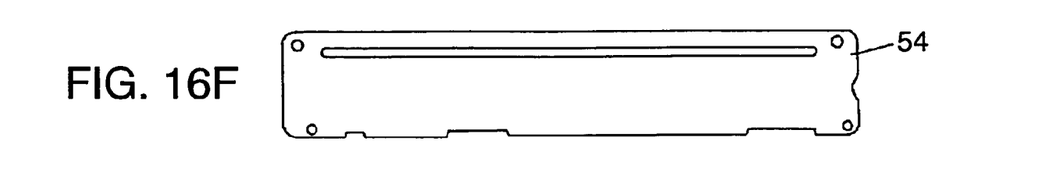

The examples shown in FIG. 16(c) through FIG. 16(f) have a longer terminal plate than those of the foregoing examples. The input terminal of FIG. 16(c) has the same structure as that shown in FIG. 13. In FIG. 16(d), five pin-jacks and one connector are employed in first input terminal 36. In FIG. 16(e), 12 pin-jacks are used as input terminals. FIG. 16(f) corresponds to FIG. 16(b), and no input terminals are placed on the side of block-unit 37.

As discussed in the foregoing exemplary embodiment, the present invention provides input signal circuit block 24 of a plasma display apparatus, and this circuit block 24 comprises the following elements:

case 34 disposed on chassis 14 and having mounting port 33 open to the outside of the housing; and block-unit 37 equipped with first signal outputting connector 35 detachably coupled to signal inputting connector 32 of the display driving circuit block, where this connector 35 is detachably fit to case 34 via mounting port 33, so that connector 35 can be detachably coupled to connector 32, and also equipped with the input terminal to which a connection cable to an external apparatus is detachably coupled.

The replacement of block-unit 37 of input-signal circuit block 24 allows the plasma display apparatus to be equipped with signal-input terminals responsive to a user's application.

In the present invention, case 34, to which block-unit 37 is mounted detachably, is mounted to chassis 14 substantially in parallel with PDP 10. Therefore, input-signal circuit block 24 formed of case 34 and block-unit 37 can be placed utilizing the thickness of the plasma display apparatus at the back side, so that overall thickness of the apparatus does not increase.

Further in the present invention, since block-unit 37 is detachably placed in case 34, block-unit 37 can be held by case 34. This structure prevents signal inputting connectors 32 and 35, where block-unit 37 is coupled to control circuit block 32, from being stressed. Connectors 32 and 35 are thus free from damage or unstable connections.

Block-unit 37 includes shielding plate 52 disposed on circuit board 50 to which components forming an input signal circuit are provided. Shielding plate 52 is fitted to the inside wall of case 34 in which block-unit 37 is placed, so that guide plate 44 that positions the block-unit is prepared. As a result, block-unit 37 is positioned before it is mounted smoothly in case 34.

As discussed in the embodiment, the two shielding plates 52 and 53 are substantially in the same size, and they are fixed to circuit board 50 at the same position on board 50. This structure allows the two shielding plates to be mounted on both the sides of board 50 at one time, yet, at the same position, so that space saving is achievable.

INDUSTRIAL APPLICABILITY

The present invention provides a plasma display apparatus that provides a user with signal input terminals appropriate to a user's need by simply replacing a block-unit of an input signal circuit block. The block-unit is detachably placed in a case, so that the case holds the block-unit. This structure prevents a connector from damage or unstable connection because stress concentrates on the connector where the block-unit is coupled to a control circuit block.

The block-unit includes a guide plate disposed on a circuit board where components forming the input signal circuit are mounted, and the guide plate is fitted to the inside wall of the case to which the block-unit is mounted, whereby the block-unit can be positioned. This guiding structure allows the block-unit to be positioned before the block-unit is mounted smoothly in the case.

The invention claimed is:

1. A plasma display apparatus comprising:
   a panel including a front substrate and a rear substrate, at least said front substrate being transparent, placed opposite to each other to form a discharge space therebetween, and a plurality of electrodes provided to said front and rear substrates;
   a display driving circuit block having a signal inputting connector, said display driving circuit block for applying a signal to said panel to perform displaying thereon, and said display driving circuit being disposed on a chassis;
   an input signal circuit block detachably coupled to said display driving circuit block and adapted to receive a video signal from an external apparatus; and
   a housing for accommodating said panel, said display driving circuit block and said input signal circuit block,
   wherein said input signal circuit block is provided to the chassis, and includes:
      a case disposed substantially in parallel with said panel on the chassis and having a mounting port open to outside of said housing; and a block-unit having a signal outputting connector mounted detachably to said case via said mounting port, said signal outputting connector being detachably coupled to said signal inputting connector of said display driving circuit block when said signal outputting connector is mounted to said case, and having an input terminal adapted to be detachably coupled to a connection cable for coupling to the external apparatus, and wherein said block-unit has a guide plate disposed on a circuit board to which components of an input signal circuit are provided, and said guide plate is fitted to an inside wall of said case, to which said block-unit is mounted for positioning said block-unit.

2. A plasma display apparatus as defined in claim 1, wherein said block-unit comprises:

a first block unit having said signal outputting connector mounted detachably to said case via said mounting port, said signal outputting connector being detachably coupled to said signal inputting connector of said display driving circuit block when said signal outputting connector is mounted to said case; and a second block-unit disposed in said case, coupled to said display driving circuit block and equipped with said input terminal adapted to be detachably coupled to the connection cable for coupling to the external apparatus.

3. The plasma display apparatus as defined in claim 2, wherein said first block unit includes a circuit board having electronic components forming an electronic circuit on both surfaces thereof, and upper and lower shielding plates respectively mounted to said surfaces of said circuit board such that said upper and lower shielding plates cover the electronic components for electromagnetically shielding the electronic components and dissipating heat generated from the electronic components, and wherein the upper and lower shielding plates have substantially the same size and are mounted to said circuit board by being fixed at an identical position on said circuit board.

4. The plasma display apparatus as defined in claim 2, wherein said first block unit comprises said guide plate on the circuit board to which components of an input signal circuit are provided and a guide for positioning said first block unit by insertion of said guide plate is located at an inside wall face of said case to which said first block unit is mounted.

5. A plasma display apparatus as defined in claim 2, wherein said case includes a standing wall for partitioning said case into a first space and a second space, and said first block unit is disposed in the first space and said second block unit is disposed in said second space.

6. The plasma display apparatus as defined in claim 5, wherein an upper face of said case has a notch formed thereon creating a separated portion, and said separated portion is bent inside said case to form said standing wall.

7. The plasma display apparatus as defined in claim 5, wherein said first block unit comprises said guide plate on the circuit board to which components of an input signal circuit are provided and a guide for positioning said first block unit by insertion of said guide plate is located at an inside wall face of said case to which said first block unit is mounted.

8. The plasma display apparatus as defined in claim 1, wherein said block-unit includes a circuit board having electronic components forming an electronic circuit on both surfaces thereof, and upper and lower shielding plates respectively mounted to said surfaces of said circuit board such that said upper and lower shielding plates cover the electronic components for electromagnetically shielding the electronic components and dissipating heat generated from the electronic components, and wherein the upper and lower shielding plates have substantially the same size and are mounted to said circuit board by being fixed at an identical position on said circuit board.

9. The plasma display apparatus as defined in claim 1, wherein said block-unit has a plurality of shielding plates, the circuit board has a hole formed therein, one of said shielding plates has a positioning tab to be inserted in the hole in the circuit board, and another of said shielding plates has a hole, to have the positioning tab inserted therein, at a location corresponding to a location of the hole of the circuit board.

10. The plasma display apparatus as defined in claim 1, further comprising a screw, wherein said block-unit has a plurality of shielding plates, the circuit board and one of said shielding plates each have a hole formed therein, another of said shielding plates has a tapped hole and said screw extends through the holes of said one of said shielding plates and the circuit board and engages the tapped hole of said another of said shielding plates for fixing said shielding plates to the circuit board.

* * * * *

UNITED STATES PATENT AND TRADEMARK OFFICE
CERTIFICATE OF CORRECTION

PATENT NO. : 7,091,665 B2 Page 1 of 1
APPLICATION NO. : 10/311433
DATED : August 15, 2006
INVENTOR(S) : Tomihide Nomoto et al.

It is certified that error appears in the above-identified patent and that said Letters Patent is hereby corrected as shown below:

IN THE CLAIMS
In column 9, claim 1, line 14, please replace "mounted for positioning" with --mounted, for positioning--.

Signed and Sealed this

Sixth Day of March, 2007

JON W. DUDAS
*Director of the United States Patent and Trademark Office*